United States Patent
Nakahi et al.

(10) Patent No.: US 7,042,298 B2
(45) Date of Patent: May 9, 2006

(54) OSCILLATOR CIRCUIT AND OSCILLATION STABILIZING METHOD

(75) Inventors: Yoshimasa Nakahi, Takatsuki (JP); Toshifumi Hamaguchi, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 51 days.

(21) Appl. No.: 10/877,987

(22) Filed: Jun. 29, 2004

(65) Prior Publication Data

US 2005/0046503 A1 Mar. 3, 2005

(30) Foreign Application Priority Data

Aug. 13, 2003 (JP) ............................... 2003-292687

(51) Int. Cl.
*H03B 5/32* (2006.01)
*H03L 1/00* (2006.01)
*H03L 5/00* (2006.01)

(52) U.S. Cl. ..................... 331/158; 331/175; 331/183
(58) Field of Classification Search ................ 331/158, 331/182, 74, 116 R, 116 FE, 160, 175, 183
See application file for complete search history.

(56) References Cited

U.S. PATENT DOCUMENTS

| | | | | |
|---|---|---|---|---|
| 5,187,453 A | | 2/1993 | Aoyagi et al. | 331/116 |
| 5,557,243 A | * | 9/1996 | Ho | 331/158 |
| 5,923,201 A | * | 7/1999 | Suzuki | 327/291 |
| 6,741,136 B1 | * | 5/2004 | Seo | 331/74 |

FOREIGN PATENT DOCUMENTS

JP          8-65048          3/1996

* cited by examiner

Primary Examiner—Robert Pascal
Assistant Examiner—James Goodley
(74) Attorney, Agent, or Firm—Steptoe & Johnson LLP (57) ABSTRACT

An oscillator circuit and an oscillation stabilizing method are provided that can improve the productivity of products, stabilize an oscillating operation, and achieve more stable operations for a system supplied with oscillation output. An output from a variable capability oscillator circuit is received by two inverters having different threshold values. Regarding voltage values that are exceeded when oscillation is stabilized in the inverters, the boundaries of the voltage values are set as an astable boundary and an astable boundary which are the threshold values of the inverters, outputs from the inverters are counted by a stable oscillation period shortening circuit based on the timing of a clock used for the system, and the capability of the variable capability oscillator circuit is maximized until oscillation is stabilized, thereby further shortening a stable oscillation period.

10 Claims, 11 Drawing Sheets

OSCILLATOR CIRCUIT AND OSCILLATION STABILIZING METHOD

BACKGROUND OF THE INVENTION

1. Field of the Invention

The present invention relates to an oscillator circuit and an oscillation stabilizing method for controlling oscillation capability by the number of driven tri-state inverters connected in parallel with a resonator together with inverters.

2. Description of the Related Art

Conventionally, oscillator circuits are widely used for generating a clock serving as a reference for operation of a computer system and so on. The oscillator circuit has a feedback resistor, inverters, and a plurality of tri-state inverters connected in parallel across a resonator and is configured to control the oscillation capability of the resonator by switching the number of driven tri-state inverters out of the plurality of tri-state inverters.

When the oscillation capability of such a conventional oscillator circuit is controlled by the number of driven tri-state inverters, the supply voltage level of the inverter used for oscillation represents a boundary.

However in the case of the conventional oscillator circuit, in which oscillation capability is controlled by the number of driven tri-state inverters using the supply voltage level of the inverter used for oscillation as a boundary, a power supply for the inverter is inevitably varied in voltage level during production. This causes a variation in the control of oscillation capability even after the production. In order to eliminate such variations, it is necessary to adjust each voltage level of the power supply for the inverter, compromising the productivity of the products.

Further, in controlling the oscillation capability, determination is uniquely made by a frequently varying voltage level and the tri-state inverters for controlling oscillation capability are always turned on/off. Thus, a number of variations occur in the oscillation capability and an oscillating operation becomes unstable.

Furthermore, once oscillation is started and if oscillation becomes too unstable to control oscillation capability, no solution is available. When the oscillation output is supplied to various systems including a computer system, the operations of these systems also become unstable.

SUMMARY OF THE INVENTION

The present invention is devised to solve the conventional problems. An object of the present invention is to provide an oscillator circuit and an oscillation stabilizing method that can improve the productivity of products, stabilize an oscillating operation, and achieve more stable operations for a system supplied with oscillation output.

In order to solve the above-described problems, a first invention is an oscillator circuit, in which a feedback resistor, inverters, and a plurality of tri-state inverters are connected in parallel across a resonator and the oscillation capability of the resonator is controlled by switching the number of driven tri-state inverters out of the plurality of tri-state inverters, comprising four inverters fed with oscillation output from the resonator, wherein each of the four inverters has a different threshold value relative to the oscillation output from the resonator, two of the four inverters have threshold values at an allowable upper limit voltage level for obtaining stable oscillation from the resonator, the other two inverters have threshold values at an allowable lower limit voltage level for obtaining stable oscillation from the resonator, and the number of driven tri-state inverters out of the plurality of tri-state inverters is switched based on an output value of each of the inverters when the oscillation output from the resonator is inputted, so that control is performed to provide the optimum oscillation capability for the oscillation of the resonator.

Further, a second invention is an oscillator circuit, in which a feedback resistor, inverters, and a plurality of tri-state inverters are connected in parallel across a resonator and the oscillation capability of the resonator is controlled by switching the number of driven tri-state inverters out of the plurality of tri-state inverters, comprising two inverters fed with oscillation output from the resonator, wherein each of the two inverters has a different threshold value relative to the oscillation output from the resonator, one of the two inverters has a threshold value at a sufficiently high voltage level indicating an upper limit for obtaining stable oscillation from the resonator, the other inverter has a threshold value at a sufficiently low voltage level indicating a lower limit for obtaining stable oscillation from the resonator, sufficiently stable oscillation from the resonator is recognized according to an output value of each of the inverters when the oscillation output from the resonator is inputted, and the plurality of tri-state inverters are switched to a driven state until the sufficiently stable oscillation is recognized, so that control is performed to shorten a stable period of the oscillation from the resonator.

In the above inventions, as a boundary for recognizing stable oscillation from the resonator, each of the inverters may have a single threshold value in a simplified manner or may have n threshold values. In either case, control is performed so as to provide the optimum oscillation capability for the oscillation of the resonator and control is performed so as to shorten a stable period of the oscillation from the resonator.

According to a third invention, when unstable oscillation is recognized by the first invention, the oscillation output to propagate is switched to an output divided from the oscillation output of the resonator, regarding a system serving as a destination of the oscillation output of the resonator, so that stable oscillation output can be propagated to the system.

According to a fourth invention, when unstable oscillation is recognized by the first invention, the unstable oscillation is propagated to the system serving as a destination of the oscillation output of the resonator, so that proper processing can be performed to back up data in the system.

As described above, according to the present invention, the voltage level of oscillation output is detected according to a threshold value of a logic circuit and logic control is performed. Thus, control can be stably performed regardless of variations occurring during production, thereby improving the productivity of the products.

Moreover, a stable oscillation period is shortened by providing the maximum oscillation capability without changing the oscillation capability until oscillation is stabilized, and the maximum voltage and the minimum voltage of oscillation are suppressed to a predetermined range of voltage levels. Thus, it is possible to prevent a tri-state buffer from being always turned on/off and achieve a stable oscillating operation.

Furthermore, when oscillation becomes unstable, the system can be backed up. Thus, it is possible to apply a signal indicating an oscillating state to the system and achieve more stable operations for the system fed with oscillation output.

DESCRIPTION OF THE EMBODIMENT

The following will specifically describe an oscillator circuit and an oscillation stabilizing method according to an embodiment of the present invention with reference to the accompanying drawings.

The present invention is broadly divided into a stable oscillation period shortening function, an oscillation stabilizing function, and an oscillation controlling function. The embodiment will be described for each of the functions. After the explanation, an embodiment will be discussed on a method of stabilizing an oscillation with software and an input control function for reducing power consumption by suppressing the inputs of inverters having different threshold values used in the stable oscillation period shortening function and the oscillation stabilizing function.

(Stable Oscillation Period Shortening Function)

The following will discuss the stable oscillation period shortening function in the oscillator circuit according to the embodiment of the present invention.

Figure 1:
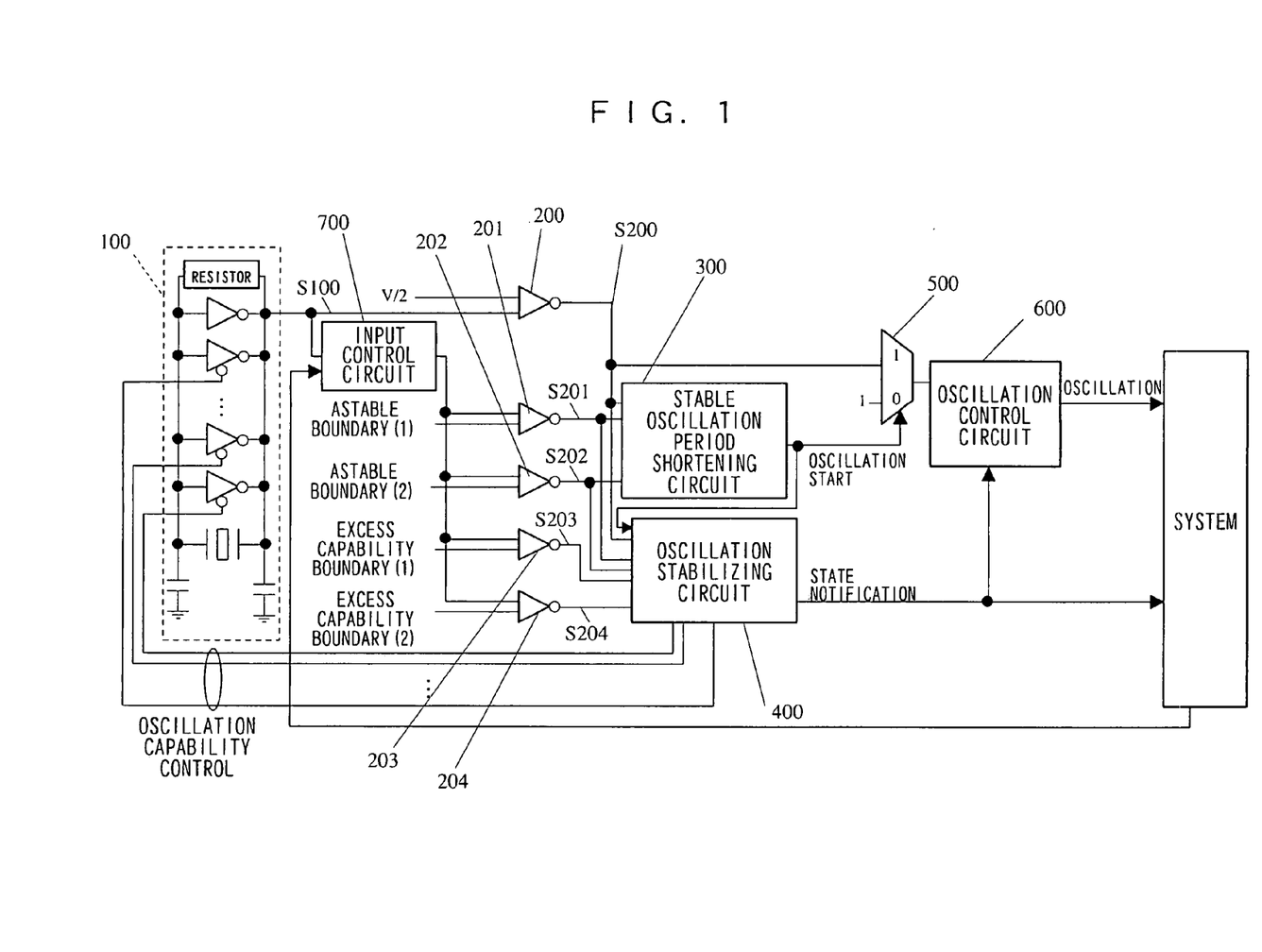
FIG. 1 is a block diagram showing an overall configuration of an oscillator circuit according to an embodiment of the present invention.
Figure 3:
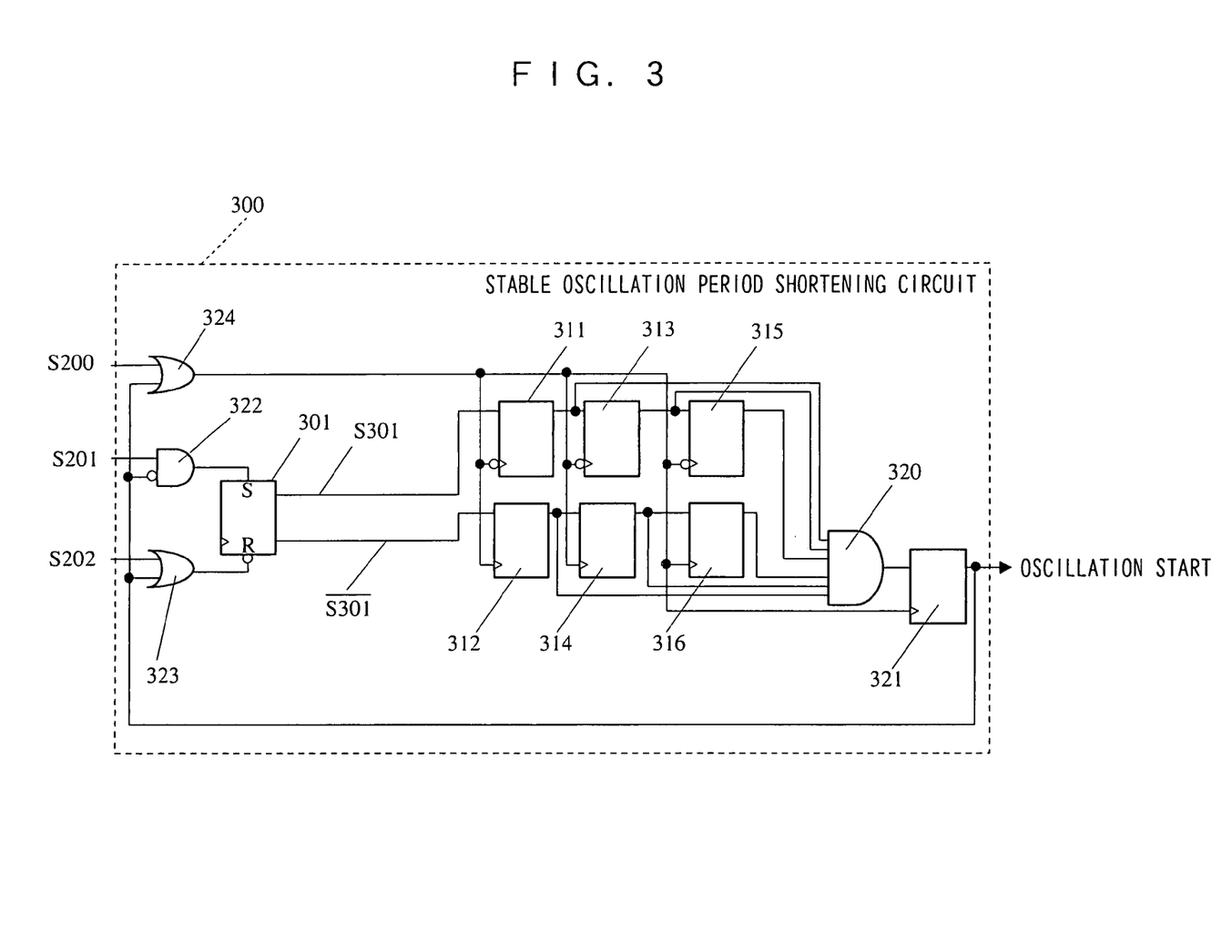
FIG. 3 is a block diagram showing a configuration of a stable oscillation period shortening circuit in the oscillator circuit of the embodiment.

FIG. 1 is a block diagram showing the overall configuration of the oscillator circuit according to the present embodiment. FIG. 3 is a block diagram showing the configuration of a stable oscillation period shortening circuit in the oscillator circuit of the present embodiment. As shown in FIG. 1, in the oscillation circuit of the present embodiment, a part concerning the stable oscillation period shortening function is composed of a variable capability oscillator circuit 100, inverters 200, 201, and 202 with different threshold values, and a stable oscillation period shortening circuit 300.

The stable oscillation period shortening circuit 300 is realized by a circuit configuration shown in FIG. 3. Flip-flops 311 to 316 of FIG. 3 are all reset when the power is turned on and are simultaneously released at an oscillation start voltage. The threshold value of the inverter 200 shown in FIG. 1 is set at half the supply voltage (V/2), the threshold value of the inverter 201 is set at an astable boundary (1) indicating a voltage level to exceed when oscillation is stabilized, and the threshold value of the inverter 202 is set at an astable boundary (2) indicating a voltage level to fall below when oscillation is stabilized.

An output S201 of the inverter 201 is inputted to the set terminal of the flip-flop 301 having set/reset terminals (or a latch having set/reset terminals) and an output S202 of the inverter 202 is inputted to the reset terminal of the flip-flop 301. When oscillation begins to stabilize and an oscillation output S100 exceeds the threshold value of the inverter 201, the flip-flop 301 having the set/reset terminals is set as t0 of FIG. 4. "1" propagates to the flip-flop 311 as the output S301. As indicated by t1 of FIG. 4, the flip-flop 311 receives the output S301 at the falling edge of an output S200 of the inverter 200 and outputs "1".

Then, when oscillation begins to stabilize and the oscillation output S100 falls below the threshold value of the inverter 202, the flip-flop 301 having the set/reset terminals is reset, "1" propagates to the flip-flop 312 as a negative output/S301 of the output S301. The flip-flop 312 receives the negative output/S301 at the rising edge of the output S200 of the inverter 200 and outputs "1".

Figure 4:
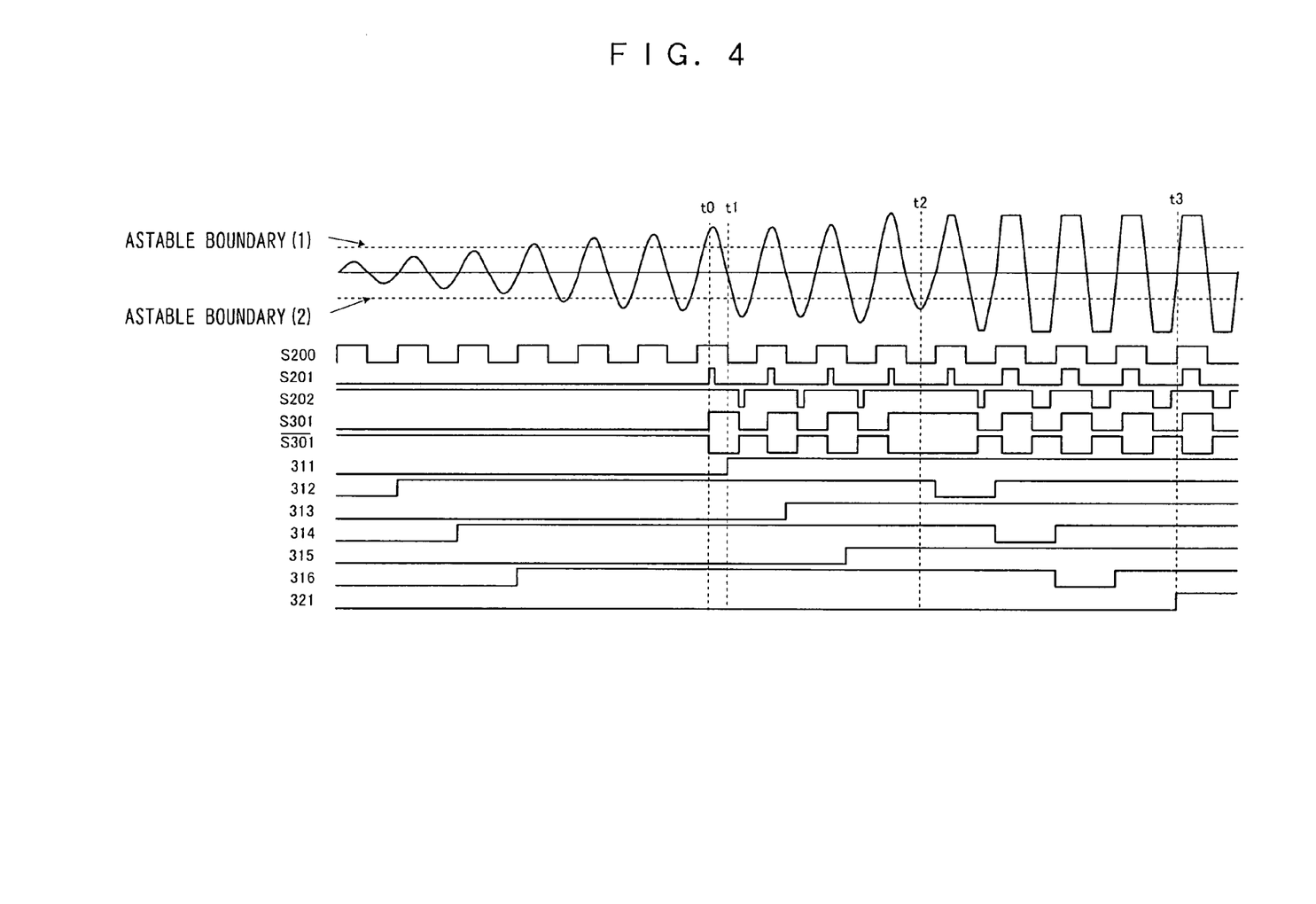
FIG. 4 is a waveform chart showing an operation of the stable oscillation period shortening circuit in the oscillator circuit of the embodiment.

According to these steps, when the flip-flops 311 and 312 consecutively count "1" n times (four times in FIG. 3), it is recognized that oscillation is stabilized as indicated by t3 of FIG. 4 and "1" is outputted from a flip-flop 321 as an oscillation start signal.

Figure 2:
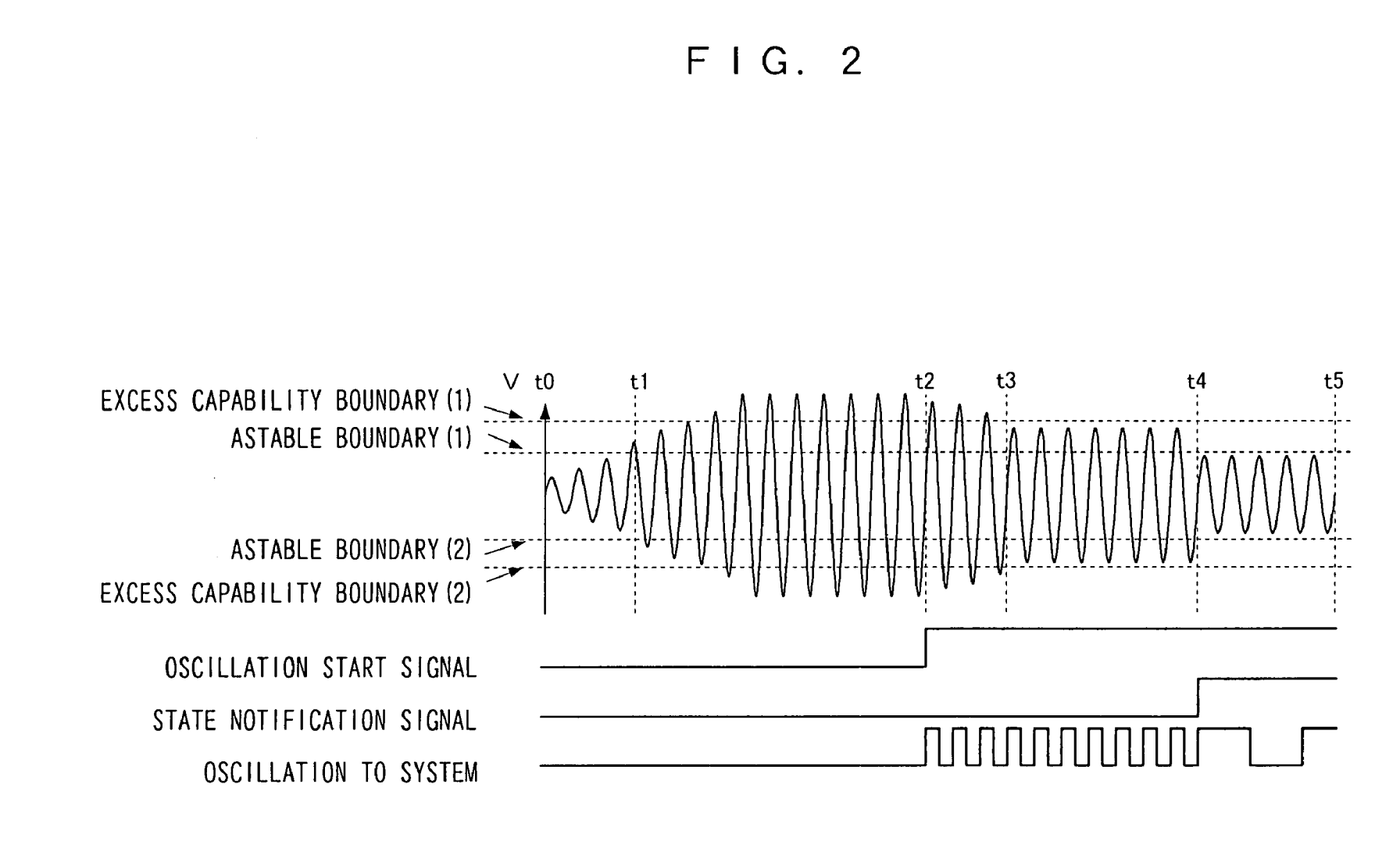
FIG. 2 is a waveform chart showing an operation of a variable capability oscillator circuit in the oscillator circuit of the embodiment.

When the flip-flops 311 and 312 do not consecutively count "1", "0" is propagated as t2 of FIG. 4. The flip-flop 321 does not output "1" until "1" is consecutively propagated. The oscillation start signal is connected to the selection terminal of a selection circuit 500 of FIG. 1, so that the output S200 of the inverter 200 is propagated to a system and a stable oscillation period is shortened. The flip-flop 321 has an output of "0" in a stable oscillation waiting period and has an output of "1" in a stable oscillation period. A section between t1 and t2 of FIG. 2 is a stable oscillation waiting section.

The inputs S201 and S202 from the inverters 201 and 202 are disconnected according to the circuit logics of an AND circuit 322 and an OR circuit 323 shown in FIG. 3 and the input S200 from the inverter 200 is disconnected according to the logic of an OR circuit 324 of FIG. 3, thereby reducing power consumption of this functional block after oscillation is stabilized. During the stable oscillation period, oscillation capability control signals from an oscillation stabilization circuit 400 of FIG. 1 are all turned on and the capability of the variable capability oscillator circuit 100 is maximized, thereby further shortening the stable oscillation period.

The inverters 201 and 202 are provided separately from the oscillation stabilization circuit 400, and the inverter 201 is set at a higher value and the inverter 202 is set at a lower value than an originally required threshold value. Thus, it is possible to reduce the number of times of counting and reduce the number of flip-flops denoted as the flip-flops 311 to 316 in FIG. 3.

(Oscillation Stabilizing Function)

The following will discuss an oscillation stabilizing function in the oscillator circuit according to the embodiment of the present invention.

Figure 5:
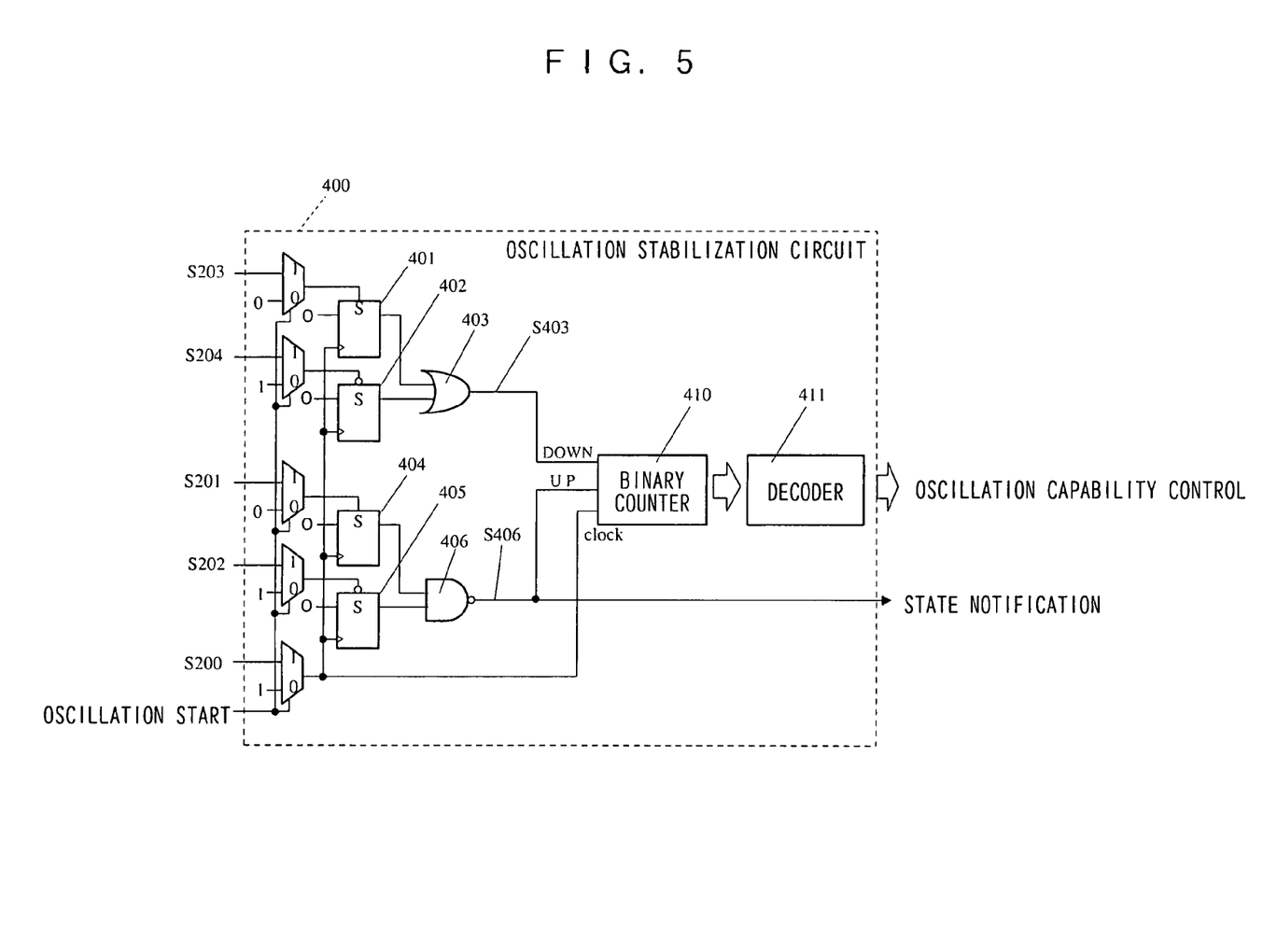
FIG. 5 is a block diagram showing a configuration of an oscillation stabilization circuit in the oscillator circuit of the embodiment.

FIG. 5 is a block diagram showing the configuration of the oscillation stabilization circuit in the oscillator circuit of the present embodiment. As shown in FIG. 1, in the oscillator circuit of the present embodiment, a part concerning the oscillation stabilizing function is composed of the variable capability oscillator circuit 100, the inverters 200, 201, 202, 203, and 204 with different threshold values, and the oscillation stabilization circuit 400.

The oscillation stabilization circuit 400 is realized by the circuit configuration of FIG. 5. Flip-flops 401, 402, 404, and 405 of FIG. 5 are all reset when the power is turned on and are simultaneously released at an oscillation start voltage. A binary counter 410 of FIG. 5 is so set as to maximize the variable capability oscillator circuit 100 upon resetting. The binary counter 410 counts up when an UP terminal is "1" at the rising of clock, and the binary counter 410 counts down when a DOWN terminal has "1".

The threshold value of the inverter 200 of FIG. 1 is set at half the supply voltage (V/2), the threshold value of the inverter 201 is set at an astable boundary (1) indicating a voltage level to exceed when oscillation is stabilized, and the threshold value of the inverter 202 is set at an astable boundary (2) indicating a voltage level to fall below when an oscillation is stabilized. The threshold value of the inverter 203 is set at an excess capability boundary (1) indicating an oscillating voltage level to exceed when oscillation capability is higher than necessary, and the threshold value of the inverter 204 is set at an excess capability boundary (2) indicating an oscillating voltage level to fall below when oscillation capability is higher than necessary.

Figure 6:
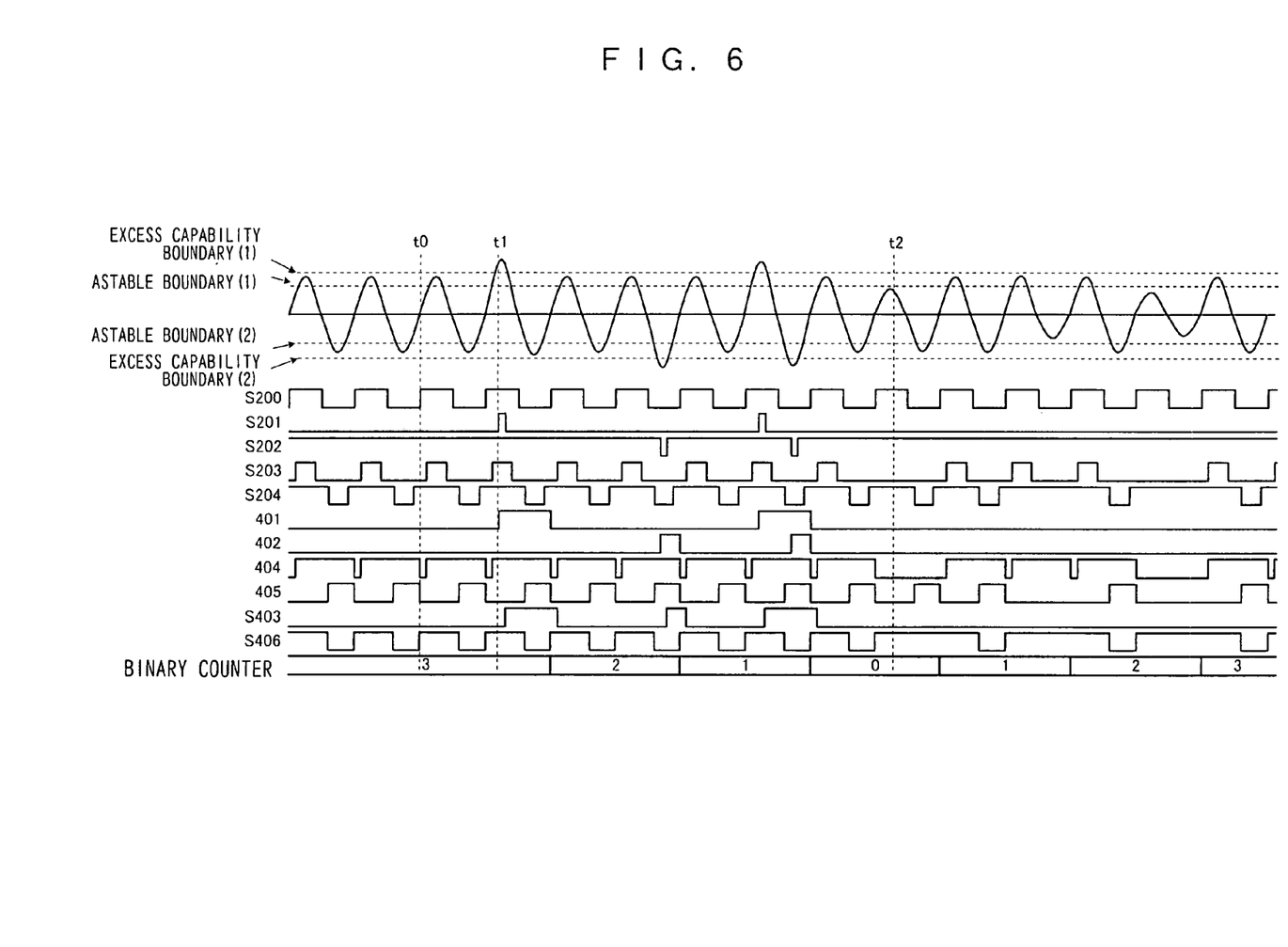
FIG. 6 is a waveform chart showing an operation of the oscillation stabilization circuit in the oscillator circuit of the embodiment.

An output S203 of the inverter 203 is connected to the set terminal of the flip-flop 401 shown in FIG. 5, an output S204 of the inverter 204 is inverted and is connected to the set terminal of the flip-flop 402 shown in FIG. 5, and an OR circuit 403 ORs the outputs of the flip-flops 401 and 402 to generate an output S403. At the output S403, "1" is outputted as indicated by t1 of FIG. 6 when the variable capability oscillator circuit 100 has high oscillation capability exceeding the threshold value of the inverter 203 or falling below the threshold value of the inverter 204.

The output S201 of the inverter 201 is connected to the set terminal of the flip-flop 404 shown in FIG. 5, the output S202 of the inverter 202 is inverted and is connected to the set terminal of the flip-flop 405 shown in FIG. 5, a NAND circuit 406 performs NAND on the outputs of the flip-flops 404 and 405 to generate an output S406. At the output S406, "1" is outputted as indicated by t2 of FIG. 6 when the oscillation capability of the variable capability oscillator circuit 100 is too low to exceed the threshold value of the inverter 201 or fall below the threshold value of the inverter 202.

The output S403 from the OR circuit 403 is connected to the DOWN terminal of the binary counter 410, the output S406 from the NAND circuit 406 is connected to the UP terminal of the binary counter 410, and the output S200 of the inverter 200 is connected to the clock terminal of the binary counter 410, so that the binary counter 410 counts down when the oscillation capability is too high and the binary counter 410 counts up when the oscillation capability is too low. The oscillation capability of the variable capability oscillator circuit 100 of FIG. 1 is increased or reduced according to the counting up/down of the counter. Thus, control is performed so that oscillation capability does not become too high or low and therefore the optimum oscillation capability is maintained.

Further, a section from t3 to t4 of FIG. 2 indicates the optimum state in which the variable capability oscillator circuit 100 has an output voltage level between the voltage levels of the threshold values set for the inverters 201 and 203 when S200 of FIG. 1 has "1", and the variable capability oscillator circuit 100 has an output voltage level between the voltage levels of the threshold values set for the inverters 202 and 204 when the output of the inverter 200 is "LOW". Oscillation becomes unstable when the variable capability oscillator circuit 100 has an output voltage level between the voltage levels of the threshold values set for the inverters 201 and 202.

In this circuit, the threshold values set for the four inverters 201, 202, 203, and 204 are used as boundaries. It is needless to say that this function can be realized in a simplified manner even with a smaller number of boundaries.

Further, S406 of FIG. 5 is propagated as a state notification signal to an oscillation control circuit 500 of FIG. 1, so that when oscillation capability becomes lower and oscillation becomes unstable, the oscillation to the system is divided to provide stable oscillation thereto. Moreover, a signal S406 of FIG. 5 is propagated as a state notification signal to the system of FIG. 1, so that proper processing such as backup can be performed.

(Oscillation Control Function)

The following will describe the oscillation control function in the oscillator circuit according to the embodiment of the present invention.

Figure 7:
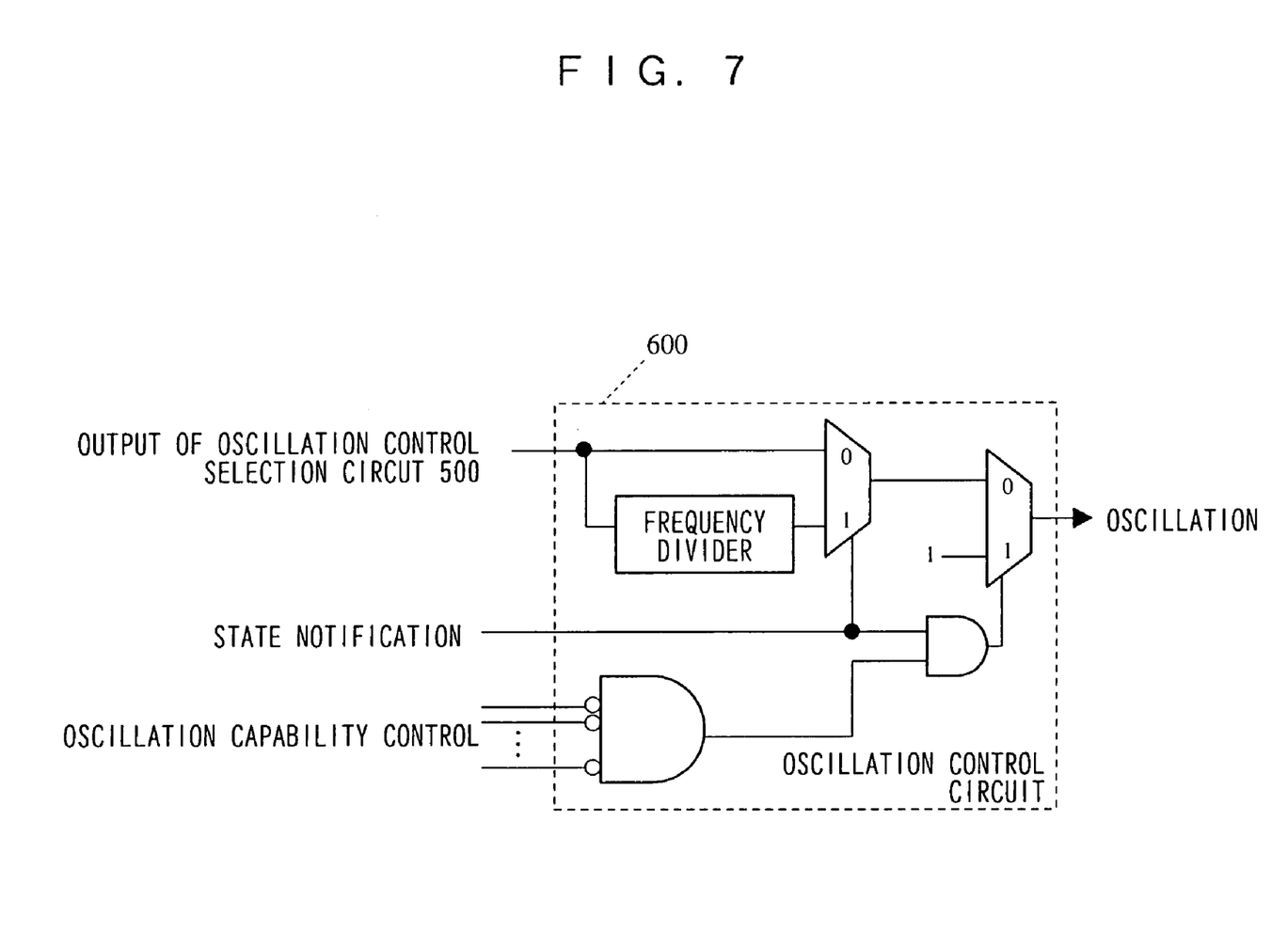
FIG. 7 is a block diagram showing a configuration of an oscillation control circuit in the oscillator circuit of the embodiment.

FIG. 7 is a block diagram showing the configuration of an oscillation control circuit in the oscillator circuit according to the present embodiment. As shown in FIG. 1, a part concerning the oscillation control function is composed of the variable capability oscillator circuit 100, the inverter 200, the oscillation start signal from the stable oscillation period shortening circuit 300, a state notification signal and an oscillation capability control signal from the oscillation stabilization circuit 400, the selection circuit 500, and an oscillation control circuit 600.

The oscillation control circuit 600 is realized by the circuit configuration of FIG. 7. The oscillation control circuit 600 propagates oscillation output to the system when the oscillation output from the variable capability oscillator circuit 100 is stabilized, an oscillation start signal from the stable oscillation period shortening circuit 300 of FIG. 1 is outputted as t2 of FIG. 2, and an oscillation signal is outputted from the selection circuit 500. When the oscillation output from the variable capability oscillator circuit 100 becomes unstable and the state notification signal from the oscillation stabilization circuit 400 of FIG. 1 becomes "1" as t4 of FIG. 2, oscillation output is propagated to the system of FIG. 1 from a divider circuit, which divides oscillation output from the inverter 200 of FIG. 1 as t0 of FIG. 8, so that a stable oscillation signal is always propagated to the system.

Figure 8:
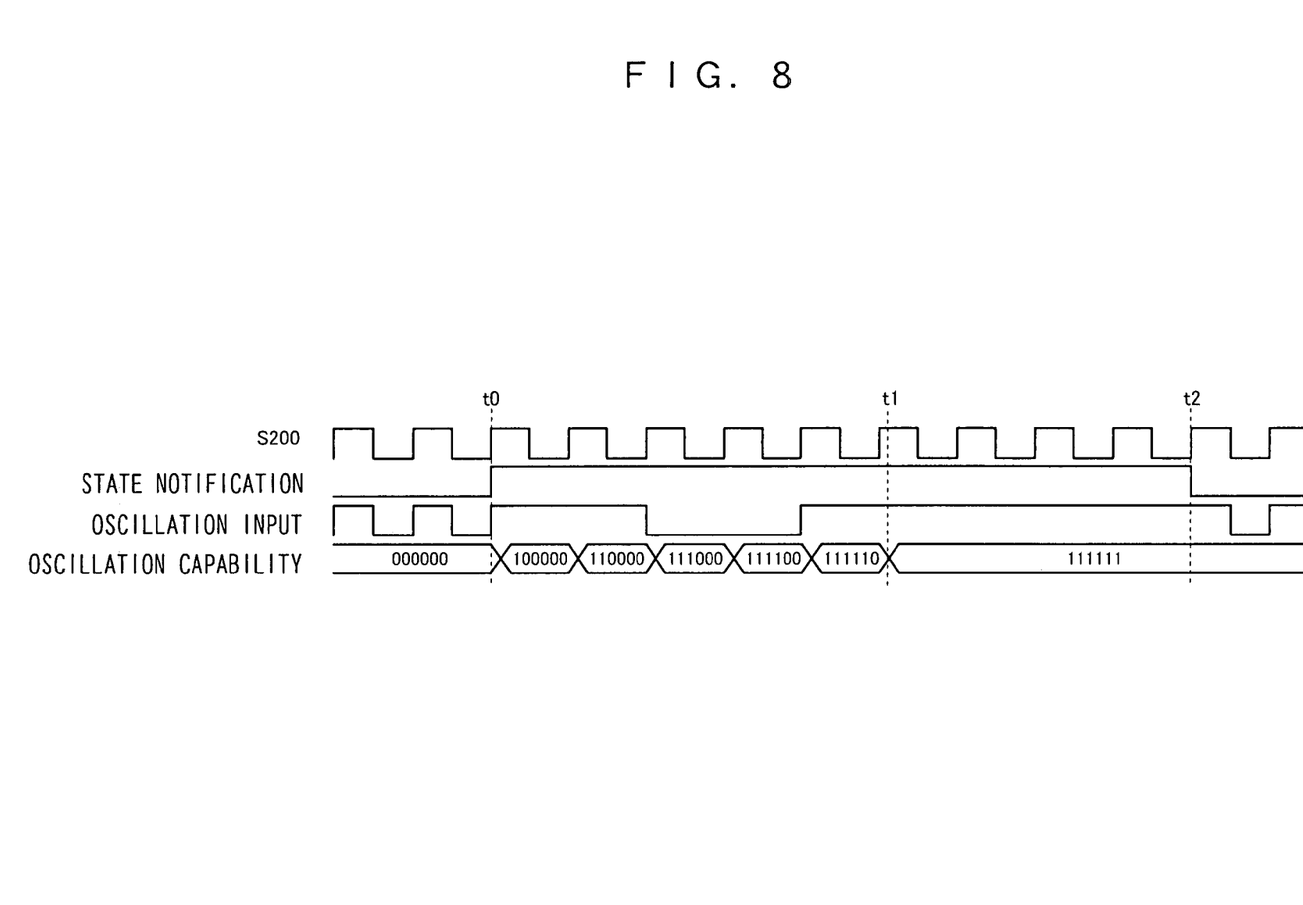
FIG. 8 is a waveform chart showing an operation of the oscillation control circuit in the oscillator circuit of the embodiment.

Further, when the oscillation capability control of the oscillation stabilization circuit 400 is maximized and the state notification signal propagates an unstable state of oscillation output, the oscillation control circuit 600 decides that oscillation output from the inverter 200 cannot be divided, and suspends oscillation output to the system as t1 of FIG. 8. Thereafter, when oscillation output is stabilized as t2 of FIG. 8, the oscillation control circuit 600 supplies oscillation output to the system.

(Input Control Function)

The following will describe an input control function in the oscillator circuit according to the embodiment of the present invention.

Figure 9:
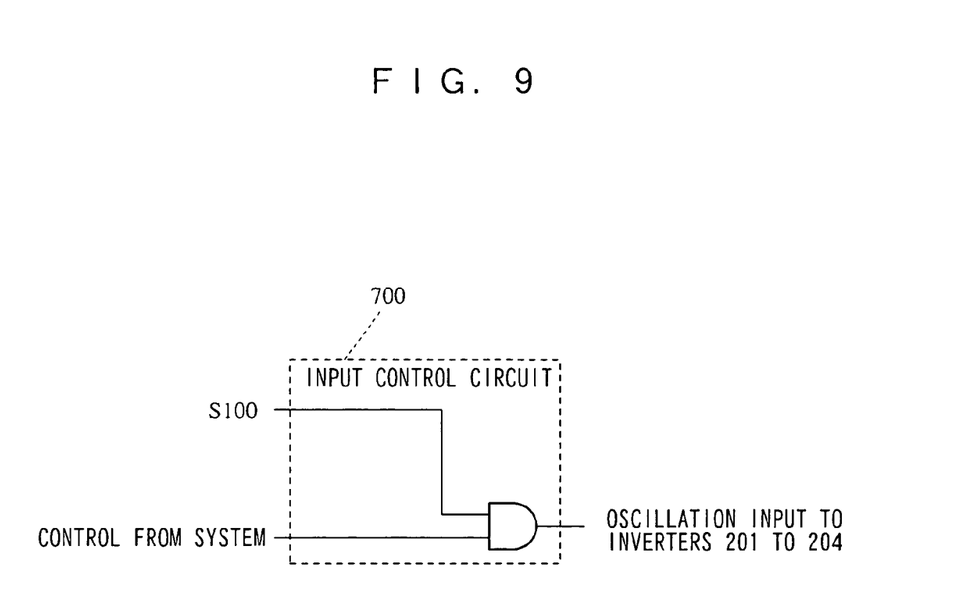
FIG. 9 is a block diagram showing a configuration of an input control circuit in the oscillator circuit of the embodiment.

FIG. 9 is a block diagram showing the configuration of an input control circuit in the oscillator circuit of the present embodiment. In the oscillator circuit of the embodiment, the plurality of inverters with different threshold values are used. Even when the above-described functions are not used, oscillation output is always inputted from the variable capability oscillator circuit 100 to the inverters, resulting in some power consumption. In contrast, the input control function of an input control circuit 700 shown in FIG. 1 suppresses oscillation output from the variable capability oscillator circuit 100 with software, thereby eliminating power consumption in the inverters. The input control circuit is realized by the configuration of FIG. 9.

As shown in FIG. 9, oscillation output to the inverters 201 to 204 is suppressed by masking the oscillation output S100 from the variable capability oscillator circuit 100 by using a control signal from the system, and the output S200 from the inverter 200 to the stable oscillation period shortening function, the oscillation stabilizing function, and the oscillation control function is also masked in a similar manner, so that the operations of the circuits for the functions are suspended and power consumption is reduced.

(Oscillation is Stabilized by Software)

Figure 10:
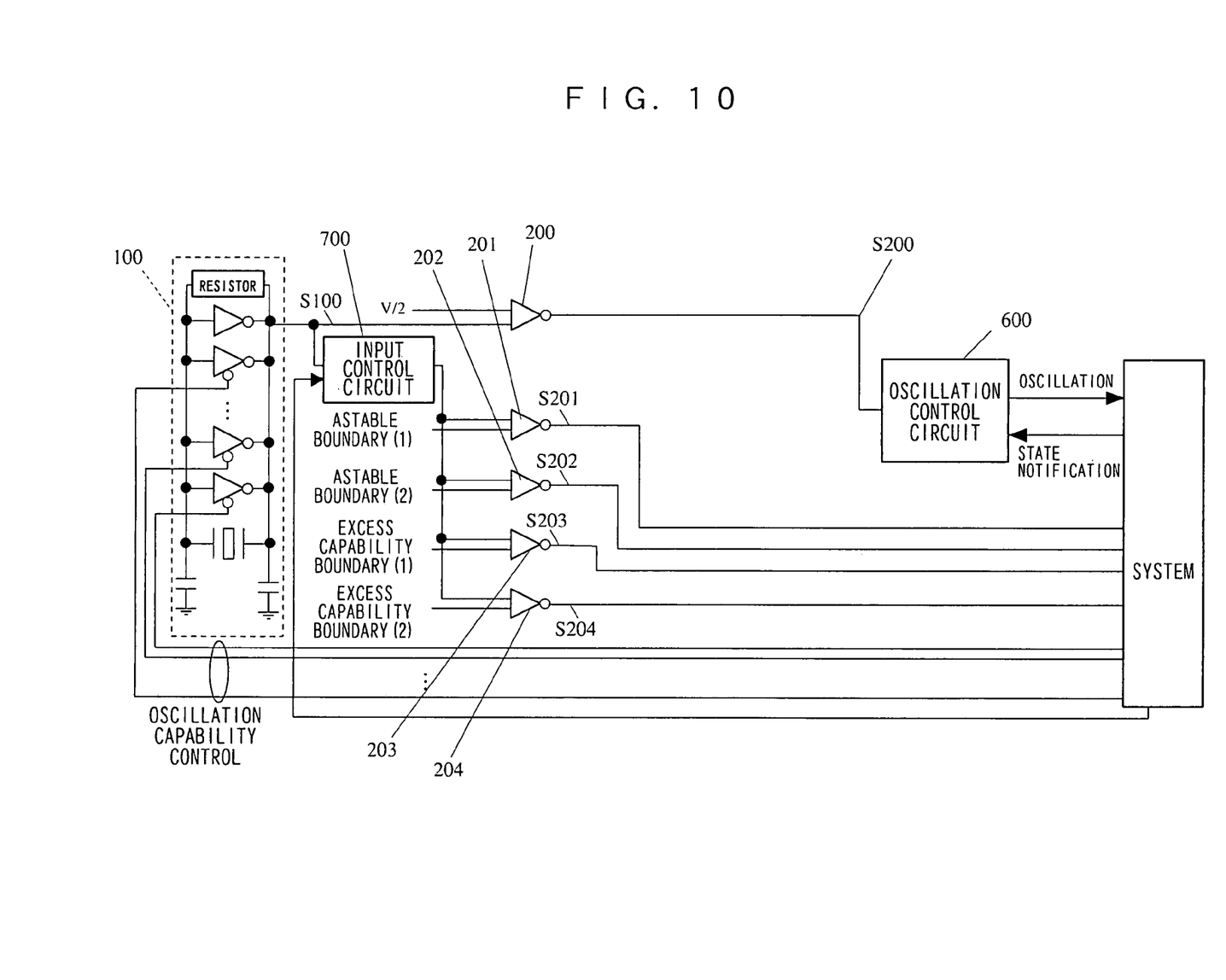
FIG. 10 is a block diagram showing a configuration for stabilizing oscillation with a software in the oscillator circuit of the embodiment.

The oscillation stabilizing function is realized also by software. The oscillation stabilizing function performed by software is realized by the circuit configuration of FIG. 10 and software for performing the flow of FIG. 11.

Figure 11:
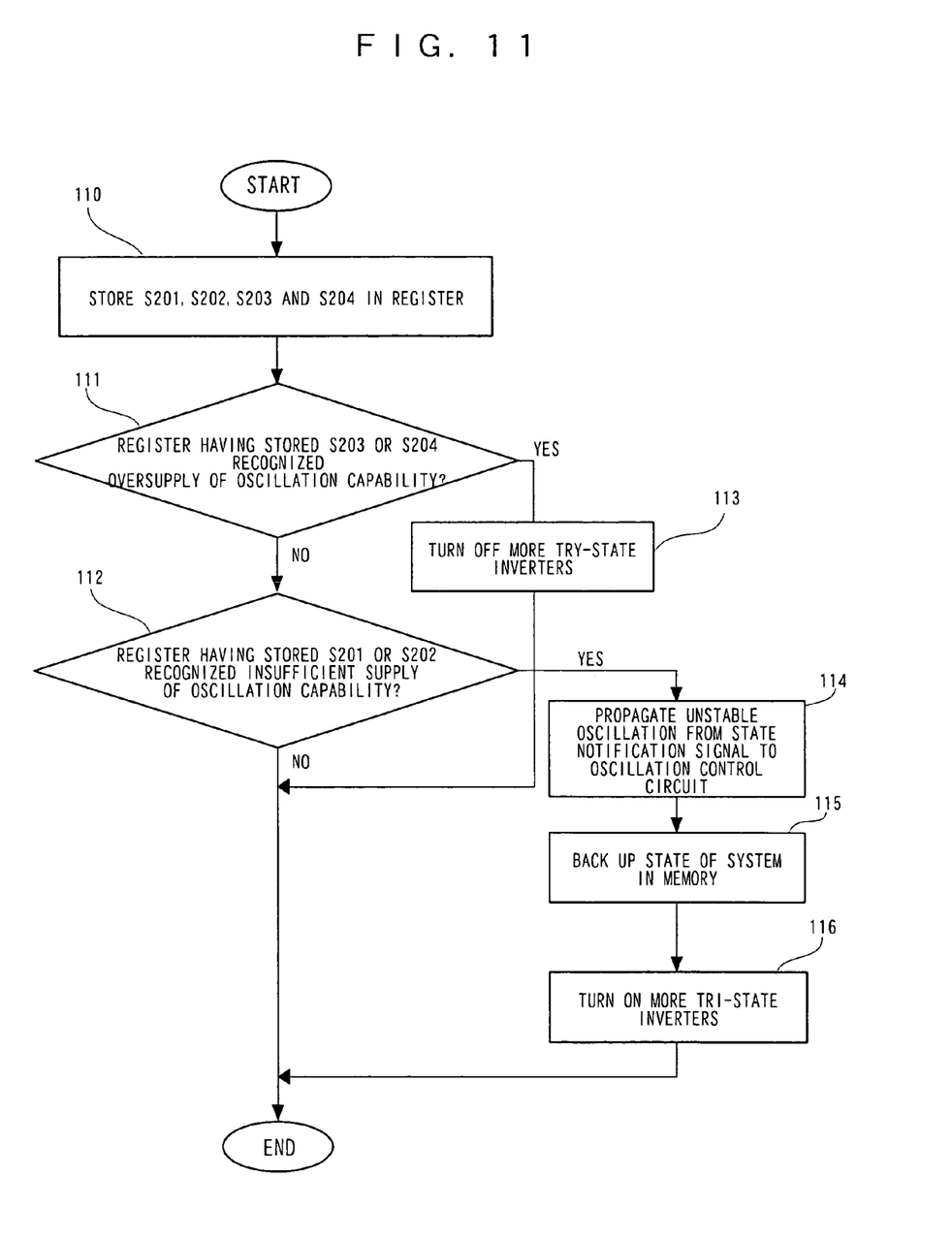
FIG. 11 is a flowchart showing an algorithm for stabilizing oscillation with a software in the oscillator circuit of the embodiment.

First S201, S202, S203, and S204 are stored in the register of the system (Step 110). Subsequently when the oscillation voltage level of the output S100 from the variable capability oscillator circuit 100 exceeds the threshold value set for the inverter 203 or falls below the threshold value set for the inverter 204 (Step 111), control is changed for a register in the system which controls the tri-state inverters of the variable capability oscillator circuit 100 and a larger number of tri-state inverters are turned off (Step 113), so that control is performed to reduce the oscillation capability of the variable capability oscillator circuit 100.

When the oscillation voltage level of the output S100 from the variable capability oscillator circuit 100 cannot exceed the threshold value set for the inverter 201 or cannot fall below the threshold value set for the inverter 202 (Step 112), the state notification signal is generated to propagate the instability of the system to the oscillation control circuit 600 (Step 114), oscillation to the system is divided to stabilize oscillation used in the system, the state of the system is backed up in a memory (Step 115), control is changed for the register in the system which controls the tri-state inverters of the variable capability oscillator circuit 100, and a larger number of tri-state inverters are turned on (Step 116), so that control is performed to increase the oscillation capability of the variable capability oscillator circuit 100.

What is claimed is:

1. An oscillator circuit, in which a feedback resistor, an inverter, and a plurality of tri-state inverters are connected in parallel across a resonator and oscillation capability of the resonator is controlled by switching the number of driven tri-state inverters out of the plurality of tri-state inverters, the oscillator circuit comprising four inverters fed with oscillation output from the resonator, wherein
each of the four inverters has a different threshold value relative to the oscillation output from the resonator, two of the four inverters have threshold values at an allowable upper limit voltage level for obtaining stable oscillation from the resonator, the other two inverters have threshold values at an allowable lower limit voltage level for obtaining stable oscillation from the resonator, and the number of driven tri-state inverters out of the plurality of tri-state inverters is switched based on an output value of each of the inverters when the oscillation output from the resonator is inputted, the plurality of tri-state inverters are switched by means of a difference of threshold values of the inverters controlling the amplitude of the oscillation circuit wherein each of the inverters receives a pre-set input threshold signal.

2. An oscillator circuit, in which a feedback resistor, an inverter, and a plurality of tri-state inverters are connected in parallel across a resonator and oscillation capability of the resonator is controlled by switching the number of driven tri-state inverters out of the plurality of tri-state inverters, the oscillator circuit comprising two inverters fed with oscillation output from the resonator, wherein
each of the two inverters has a different threshold value relative to the oscillation output from the resonator, one of the two inverters has a threshold value at a sufficiently high voltage level indicating an upper limit for obtaining stable oscillation from the resonator, the other inverter has a threshold value at a sufficiently low voltage level indicating a lower limit for obtaining stable oscillation from the resonator, sufficiently stable oscillation from the resonator is recognized according to an output value of each of the inverters when the oscillation output from the resonator is inputted, and the plurality of tri-state inverters are switched to a driven state until the sufficiently stable oscillation is recognized, the plurality of tri-state inverters are switched by means of a difference of threshold values of the inverters controlling the amplitude of the oscillation circuit wherein each of the incerters receives a pre-set input threshold signal.

3. An oscillator circuit, in which a feedback resistor, an inverter, and a plurality of tri-state inverters are connected in parallel across a resonator and oscillation capability of the resonator is controlled by switching the number of driven tri-state inverters out of the plurality of tri-state inverters, the Oscillator circuit comprising n inverters fed with oscillation output from the resonator, and a register for holding output values of the n inverters, wherein
each of the n inverters has a different threshold value relative to the oscillation output from the resonator, m (m<n) of the n inverters have threshold values each of which is set at a voltage level exceeding a voltage level of excess oscillation capability, one of the n inverters has a threshold value set at a voltage level falling below a voltage level of insufficient oscillation capability, and the oscillator circuit has an oscillation stabilizing function of changing the plurality of tri-state inverters sequentially to a driven state to increase oscillation capability of the resonator when the register has a value changed to indicate unstable oscillation from the resonator due to the insufficient oscillation capability based on output values of the n inverters, reducing the plurality of tri-state inverters sequentially to a suspended state to reduce the oscillation capability of the resonator when the register has a value changed to indicate the excess oscillation capability based on the output values of the n inverters, switching the number of driven tri-state inverters out of the plurality of tri-state inverters according to the oscillation capability of the resonator to control the oscillation capability of the resonator, and stabilizing the oscillation from the resonator; and a selection circuit which is fed with the oscillation output from the resonator and a signal obtained by dividing the oscillation output, and selects one of the oscillation output and the signal, wherein the selection circuit has an oscillation control function of selecting the signal obtained by dividing the oscillation output from the resonator, based on the notification signal indicating unstable oscillation from the resonator, and controlling an oscillating frequency.

4. An oscillator circuit, in which a feedback resistor, an inverter, and a plurality of tri-state inverters are connected in parallel across a resonator and oscillation capability of the resonator is controlled by switching the number of driven tri-state inverters out of the plurality of tri-state inverters, the oscillator circuit comprising two inverters fed with oscillation output from the resonator, a holding circuit which has a function of setting and resetting an input signal and is composed of a flip-flop or latch for holding the input signal upon setting and resetting, and a circuit for counting an output signal of the holding circuit, wherein each of the two inverters has a different threshold value relative to the oscillation output from the resonator, when the oscillation output from the resonator is inputted, it is recognized that a level of the oscillation output exceeds each of the threshold values, the holding circuit holds outputs of the two inverters upon setting and resetting, the oscillator circuit having a stable oscillation period shortening function wherein an output signal from the holding circuit is counted, a stable state of oscillation from the resonator is recognized according to a counted value, the number of driven tri-state inverters of the plurality of tri-state inverters is switched according to the stable state of oscillation to control the oscillation capability of the resonator, and a period until oscillation is stabilized is shortened, and a selection circuit which is fed with the oscillation output from the resonator and a signal obtained by dividing the oscillation output, and selects one of the oscillation output and the signal, wherein the selection circuit has an oscillation control function of selecting the signal obtained by dividing the oscillation output from the resonator, based on the notification signal indicating unstable oscillation from the resonator, and controlling an oscillating frequency.

5. The oscillator circuit according to claim 4, further comprising, as the oscillation control function, a function of stopping an output of a selection signal from the selection circuit in response to the notification signal indicating the unstable oscillation from the resonator.

6. An oscillation stabilizing method for stabilizing oscillation of an oscillator circuit, in which a feedback resistor, an inverter, and a plurality of tri-state inverters are connected in parallel across a resonator and oscillation capability of the resonator is controlled by switching the number of driven tri-state inverters out of the plurality of tri-state inverters, the method comprising the steps of:

setting two of the four inverters with threshold values at an allowable upper limit voltage level for obtaining stable oscillation from the resonator, setting the other two inverters with threshold values at an allowable lower limit voltage level for obtaining stable oscillation from the resonator, the threshold values inputted to the two inverters fed with oscillation output from the resonator, each being different from the oscillation output from the resonator, and switching the number of driven tri-state inverters out of the plurality of tri-state inverters by means of a difference of threshold values of the inverters controlling the amplitude of the oscillator wherein each of the inverters receives a pre-set input threshold signal.

7. An oscillation stabilizing method for stabilizing oscillation of an oscillator circuit, in which a feedback resistor, an inverter, and a plurality of tri-state inverters are connected in parallel across a resonator and oscillation capability of the resonator is controlled by switching the number of driven tri-state inverters out of the plurality of tri-state inverters, the method comprising the steps of:

setting one of the inverters with a threshold value at a sufficiently high voltage level indicating an upper limit for obtaining stable oscillation from the resonator, setting the other inverter with a threshold value at a sufficiently low voltage level indicating a lower limit for obtaining stable oscillation from the resonator, the threshold values inputted to the two inverters fed with oscillation output from the resonator, each being different from the oscillation output from the resonator, recognizing sufficiently stable oscillation from the resonator based on an output value of each of the inverters when the oscillation output from the resonator is inputted, and switching the plurality of tri-state inverters to a driven state until the sufficiently stable oscillation is recognized, wherein switching the number of driven inverters is performed by means of a difference of threshold values of the inverters controlling the amplitude of the oscillator wherein each of the inverters receives a pre-set input threshold signal.

8. An oscillation stabilizing method for stabilizing oscillation of an oscillator circuit, in which a feedback resistor, an inverter, and a plurality of tri-state inverters are connected in parallel across a resonator and oscillation capability of the resonator is controlled by switching the number of driven tri-state inverters out of the plurality of tri-state inverters, the method comprising the steps of:

setting m (m<n) inverters with threshold values each of which is set at a voltage level exceeding excess oscillation capability, setting one of the other inverters with a threshold value set at a voltage level falling below a voltage level of insufficient oscillation capability of the resonator, the threshold values inputted to the n inverters fed with oscillation output from the resonator being different from each other relative to the oscillation output from the resonator, storing output values of the n inverters in a register when the oscillation output from the resonator is inputted, as an oscillation stabilizing function, changing the plurality of tri-state inverters sequentially to a driven state to increase the oscillation capability of the resonator when the register has a value changed to indicate unstable oscillation from the resonator due to the insufficient oscillation capability, reducing the plurality of tri-state inverters sequentially to a suspended state to reduce the oscillation capability of the resonator when the register has a value changed to indicate the excess oscillation capability, switching the number of driven tri-state inverters out of the plurality of tri-state inverters according to the oscillation capability of the resonator to control the oscillation capability of the resonator, wherein switching the number of driven inverters is performed by means of a difference of threshold values of the inverters controlling the amplitude of the oscillator, wherein each of the inverters receives a pre-set input threshold signal and stabilizing the oscillation from the resonator.

9. An oscillation stabilizing method for stabilizing oscillation of an oscillator circuit, in which a feedback resistor, an inverter, and a plurality of tri-state inverters are connected in parallel across a resonator and oscillation capability of the resonator is controlled by switching the number of driven tri-state inverters out of the plurality of tri-state inverters, the method comprising the steps of:

setting two inverters at different threshold values relative to the oscillation output from the oscillator, the inverters being fed with oscillation output from the resonator, recognizing by the two inverters that a level of the oscillation output exceeds each of the threshold values when the oscillation output from the resonator is inputted, holding recognition outputs of the two inverters upon setting and resetting by a holding circuit composed of a flip-flop or a latch, counting an output signal from the holding circuit by holding the recognition output as a stable oscillation period shortening function, recognizing a stable state of oscillation from the resonator based on a counted value, switching the number of driven tri-state inverters out of the plurality of tri-state inverters according to the stable state of the oscillation from the resonator to control the oscillation capability of the resonator, and shortening a period until oscillation is stabilized, wherein as an oscillation control function, one of the oscillation output from the resonator and the signal obtained by dividing the oscillation output is selected based on the notification signal indicating unstable oscillation from the resonator, and an oscillating frequency is controlled relative to the oscillation output from the resonator.

10. The oscillation stabilizing method according to claim 9, wherein as an oscillation control function, an output of the selection signal is stopped in response to the notification signal indicating the unstable oscillation from the resonator.

* * * * *